United States Patent
Grinwald

(10) Patent No.: US 7,807,326 B2
(45) Date of Patent: Oct. 5, 2010

(54) PRINTING SEMICONDUCTING COMPONENTS

(75) Inventor: Yaron Grinwald, Gedera (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 1353 days.

(21) Appl. No.: 11/259,829

(22) Filed: Oct. 27, 2005

(65) Prior Publication Data

US 2006/0093937 A1  May 4, 2006

(51) Int. Cl.
*G03G 9/12* (2006.01)
*G03G 9/08* (2006.01)

(52) U.S. Cl. .............. 430/108.3; 430/108.1; 430/108.7; 430/110.3; 430/114; 430/115; 430/120.2

(58) Field of Classification Search .............. 430/108.1, 430/108.7, 110.3, 114, 115, 120.2, 117.1, 430/117.4, 117.5, 119.1, 108.3
See application file for complete search history.

(56) References Cited

U.S. PATENT DOCUMENTS

| | | | | |
|---|---|---|---|---|
| 4,701,389 A | * | 10/1987 | Morimoto et al. ...... | 430/108.21 |
| 4,794,651 A | * | 12/1988 | Landa et al. ............. | 430/109.3 |
| 4,824,754 A | | 4/1989 | Mikami | |
| 4,948,692 A | * | 8/1990 | Higashimura et al. .... | 430/108.1 |
| 5,366,839 A | * | 11/1994 | Aoki ........................ | 430/109.3 |
| 5,371,380 A | * | 12/1994 | Saito et al. ..................... | 257/52 |
| 5,908,729 A | * | 6/1999 | Landa et al. ................ | 430/45.2 |
| 6,086,442 A | * | 7/2000 | Sandhu et al. ................. | 445/24 |
| 6,652,075 B2 | * | 11/2003 | Jacobson ...................... | 347/55 |
| 2002/0142239 A1 | | 10/2002 | Sakimura et al. | |
| 2003/0188928 A1 | | 10/2003 | Okuno et al. | |
| 2004/0054031 A1 | | 3/2004 | Jacobson | |
| 2004/0082098 A1 | * | 4/2004 | Schmid ........................ | 438/99 |

FOREIGN PATENT DOCUMENTS

JP    2005-173048    *    6/2005

OTHER PUBLICATIONS

Japanese Patent Office machine-assisted translation of JP 2005-173048 (pub. Jun. 2005).*
Diamond, A.S., et. al., ed., Handbook of Imaging Materials, Second edition, Marcel Dekker, Inc., NY (2002), pp. 178-180 and 200.*

* cited by examiner

*Primary Examiner*—Janis L Dote

(57) ABSTRACT

A toner particle for use in electrostatic printing of a semiconducting electronic device, the particle comprising: a resin; and non-organic semiconductor particles dispersed in the resin.

21 Claims, 4 Drawing Sheets

PRINTING SEMICONDUCTING COMPONENTS

CROSS-REFERENCE TO RELATED APPLICATIONS

This application incorporates by this reference all subject matter contained in Patent Application Serial No. 0424138.6, as filed in the United Kingdom on 29 Oct. 2004, and entitled "Printing Semiconducting Components". Further, the benefit of the filing date of such application is claimed to the fullest extent permitted by 35 U.S.C. §119.

FIELD OF THE INVENTION

The invention relates to methods of printing electronic circuit elements and in particular semiconducting electronic components.

BACKGROUND OF THE INVENTION

Methods for printing images by depositing patterns of materials—inks or toners—on substrates are well known. These methods are generally fast, inexpensive and suitable for printing a very large number of copies of an image rapidly. Depending on the printing method, printing resolution may be as fine as ten or a few tens of microns. Photolithography methods for producing modern integrated circuitry are methods for depositing patterns of materials on substrates and typically provide pattern deposition resolutions that are better than a few tenths of a micron. However, these methods are extremely expensive, slow and complicated compared to printing methods.

Whereas pattern resolutions equal to and better than a few tenths of a micron are required for producing very fast integrated circuits, there are many applications for which substantially less resolution is sufficient. For example, for producing TV and flat panel displays, circuit manufacturing techniques having pattern resolutions of about 10 microns are often sufficient and for simple circuits, such as those used in toys, even lower resolution may be sufficient. Therefore, if printing techniques that are used to print images at resolutions of about ten microns or a few tens of microns can be adapted to print materials suitable for producing electronic components and display elements, circuitry, such as video displays, could be produced in large quantities at costs that are small fractions of current costs.

Different approaches for printing circuitry are under investigation and printing inks of various kinds suitable for, for example, screen, gravure, offset, electrostatic, ink-jet and micro-contact printing of circuit elements are under development.

U.S. Pat. No. 6,652,075, the disclosure of which is incorporated herein by reference, describes semiconducting inks suitable for ink-jet type printing or screen printing. The patent notes that the semiconducting inks may be produced by dispersing a semiconducting powder such as Si, Germanium or GaAs powder with n-type or p-type impurities in a binder.

U.S. Pat. No. 6,274,412, the disclosure of which is incorporated herein by reference, describes using printing techniques to manufacture an active matrix liquid crystal display (AMLCD). However, printing is limited in this disclosure to electrostatic printing of metal conductors for gate and data lines of the array and Indium Tin Oxide (ITO) pixel electrodes. Semiconducting components of thin film transistors (TFT) used to control the matrix are described as being produced by plasma enhanced chemical vapor deposition (PECVD).

SUMMARY OF THE INVENTION

An aspect of some embodiments of the present invention relates to providing a toner that can be printed using an electrostatographic printing process to provide semiconducting regions of electronic components. Electrostatographic printing processes include electrophotographic and other electrostatic printing processes in which electrostatic fields, with or without time varying perturbations or modulations, are used to transport toner particles to form an image. Some examples of such processes are electrophotographic printing, by liquid toner electrophoresis or full or partial thickness layerwise transfer of concentrated toner layers In accordance with an aspect of some embodiments of the invention, a "semiconducting" toner comprises toner particles that include a polymer in which a semiconducting powder is dispersed. The semiconducting powder optionally comprises a conventional semiconducting material, such as n-type or p-type polycrystalline silicon or germanium. Optionally, the toner is a liquid toner and the toner particles are dispersed in a carrier liquid. Optionally, the liquid toner is produced using a method adapted from methods used to produce pigmented electrostatographic toners. In such an adapted method, during production of the toner, a procedure for adding pigment to produce a pigmented toner, is replaced by a procedure for adding a semiconducting powder to the toner.

There is therefore provided in accordance with an embodiment of the present invention, a toner particle for use in electrostatic printing of a semiconducting electronic device, the particle comprising: a resin; and solid semiconductor particles dispersed in the resin. Optionally, the toner particle has a relatively flat body from which relatively elongate tentacles extend.

Optionally, the concentration of the semiconductor particles is from 25% to 95% by weight of the non-volatile solids in the toner particle. Optionally, the concentration of the semiconductor particles is from 35% to 85% by weight of the non-volatile solids in the toner particle. Optionally, the concentration of the semiconductor particles is from 45% to 75% by weight of the non-volatile solids in the toner particle. Optionally, the concentration of the semiconductor particles is about 90% by weight of the non-volatile solids in the toner particles.

In some embodiments of the invention, the toner particles comprise a binding material that binds the semiconductor particles to the resin. Optionally, the toner particles comprise a charge director and the binding material binds to the charge director. Optionally, the concentration of semiconductor particles by weight is greater than about 70% of the nonvolatile solids in the toner particle. Optionally, the binding material comprises Aluminum Butoxide.

In some embodiments of the invention, the semiconductor material comprises silicon. Optionally, the silicon comprises polycrystalline silicon. Optionally, the polycrystalline silicon is p-type polycrystalline silicon. Optionally, the polycrystalline silicon is n-type polycrystalline silicon.

In some embodiments of the invention, the semiconductor material comprises germanium. Optionally, the germanium comprises polycrystalline germanium. Optionally, the polycrystalline germanium is p-type polycrystalline germanium. Optionally, the polycrystalline germanium is n-type polycrystalline germanium.

Optionally, the resin comprises a material chosen from the group consisting of: Ethylene acrylic acid and methacrylic acid copolymer resin; Ethylene acrylic acid copolymer resin; Acid-modified ethylene acrylate copolymer resin; Copolymer of Ethylene-Glycidyl Methacrylate; Terpolymer of Ethylene-Methyl Acrylate-Glycidyl Methacrylate; and Terpolymer of Ethylene-Ethyl Acrylate-Maleic Anhydride.

Optionally, the toner particles are dispersed in a carrier liquid.

There is further provided in accordance with an embodiment of the invention, a method of producing a semiconducting device comprising: forming at least one first layer of material suitable for controlling a second layer of semiconducting material in contact with the at least one first layer to perform a desired electrical function; and forming the second layer of semiconducting material using an electrostatographic printing process to print a layer of toner particles in accordance with claim 1 that contacts the at least one first layer.

Optionally, the toner particles have a relatively flat body from which relatively elongate tentacles extend. Optionally, the concentration of the semiconductor particles is from 25% to 95% by weight of the non-volatile solids in the toner particles. Optionally, the concentration of the semiconductor particles is from 35% to 85% by weight of the non-volatile solids in the toner particles. Optionally, the concentration of the semiconductor particles is from 45% to 75% by weight of the non-volatile solids in the toner particles. Optionally, the concentration of the semiconductor particles is about 90% by weight of the non-volatile solids in the toner particles.

Optionally the particles comprise a binding material that binds the semiconductor particles to the resin. Optionally, the toner particles comprise a charge director and the binding material binds to the charge director. Optionally, the concentration of semiconductor particles by weight is greater than about 70% of the nonvolatile solids in the toner particles. Optionally, the binding material comprises Aluminum Butoxide.

In some embodiments of the invention, the semiconductor material comprises silicon. Optionally, the silicon comprises polycrystalline silicon. Optionally, the polycrystalline silicon is p-type polycrystalline silicon. Optionally, the polycrystalline silicon is n-type polycrystalline silicon.

In some embodiments of the invention, the semiconductor material comprises germanium. Optionally, the germanium comprises polycrystalline germanium. Optionally, the polycrystalline germanium is p-type polycrystalline germanium. Optionally, the polycrystalline germanium is n-type polycrystalline germanium.

Optionally, the resin comprises a material chosen from the group consisting of: Ethylene acrylic acid and methacrylic acid copolymer resin; Ethylene acrylic acid copolymer resin; Acid-modified ethylene acrylate copolymer resin; Copolymer of Ethylene-Glycidyl Methacrylate; Terpolymer of Ethylene-Methyl Acrylate-Glycidyl Methacrylate; and Terpolymer of Ethylene-Ethyl Acrylate-Maleic Anhydride.

Optionally, the toner particles are dispersed in a carrier liquid.

Optionally, printing comprises forming a layer of the toner particles and transferring the toner layer to the substrate or to a layer on the substrate.

In some embodiments of the invention, forming the toner layer comprises heating the toner particles so that they form a continuous film. Optionally, forming the toner layer comprises forming the toner layer on an intermediate transfer member of an electrostatographic printing press.

In some embodiments of the invention, the semiconducting device is a p-n junction. In some embodiments of the invention, the semiconducting device is a diode. In some embodiments of the invention, the semiconducting device is a TFT. Optionally, the TFT is a FETFT.

There is further provided in accordance with an embodiment of the invention, a method of producing a semiconducting device comprising: forming a first semiconductor region on a substrate; and using an electrostatographic printing process to print a second semiconducting layer of toner particles in accordance with claim 1 that contacts the semiconductor region and forms a semiconducting junction with it. Optionally, forming a first semiconductor region comprises printing said region using an electrostatographic printing process utilizing toner particles in accordance with an embodiment of the invention.

BRIEF DESCRIPTION OF FIGURES

Non-limiting examples of embodiments of the present invention are described below with reference to figures attached hereto, which are listed following this paragraph. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1A:
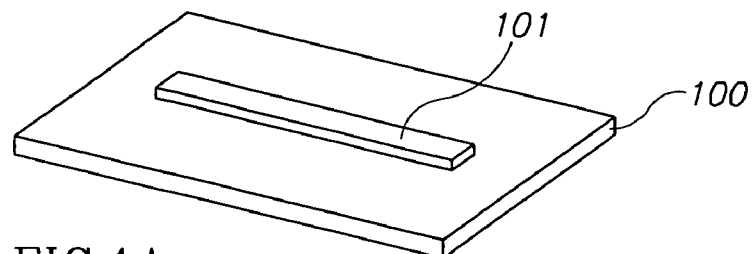
FIGS. 1A-1F schematically illustrate production of an experimental diode comprising a p-n junction in accordance with an embodiment of the invention.

Various methods known in the art to produce a toner suitable for use in an electrostratographic printing method may be adapted to produce a semiconductor toner in accordance with an embodiment of the invention.

By way of example, a toner in accordance with an embodiment of the invention may be prepared by mixing a suitable polymer together with a quantity of a carrier liquid so that the carrier liquid is between about 25% to 40% by weight of the mixture. Optionally, the polymer comprises at least one polymer chosen from the group consisting of: Ethylene acrylic acid and methacrylic acid copolymer resin; Ethylene acrylic acid copolymer resin; Acid-modified ethylene acrylate copolymer resin; Copolymer of Ethylene-Glycidyl Methacrylate; Terpolymer of Ethylene-Methyl Acrylate-Glycidyl Methacrylate; and Terpolymer of Ethylene-Ethyl Acrylate-Maleic Anhydride. Optionally, the polymer comprises NUCREL® 699 (a copolymer of ethylene and methacrylic acid, made with nominally 11 wt % methacrylic acid) and/or BYNEL® 2022 (acid modified ethylene acrylate resins), manufactured by Du Pont. Optionally, the carrier liquid comprises an isoparaffin such as ISOPAR® L manufactured by EXXON.

In an exemplary method of producing semiconducting toner, the polymer and carrier liquid are loaded into a mixer, such as a Ross mixer, and mixed for between about 0.5 to about 2.5 hours at a temperature of about 110° C. to produce a slurry comprising polymer particles plasticized by solvation with the carrier liquid. During a following additional period of mixing, the slurry is allowed to cool to room temperature. The slurry is then ground for about eight hours together with a charge adjuvant (e.g. Aluminum Tristearate) at a temperature of between about 20° C. to about 55° C. in an attritor loaded with 3/16" carbon steel balls as grinding medium. At the end of the grinding period, the mixture comprises polymer particles having a relatively flat body from which relatively elongate appendages or "tentacles" extend.

A semiconductor powder is added to the toner particle mixture in an amount so that after addition it accounts for between 25% and 95% by weight of the non-volatile solids in the slurry and high shear mixed with the slurry for a few minutes to percolate the powder through the toner particles. Optionally, the powder accounts for from 35% to 85% by weight of the non-volatile solids. Optionally, the powder accounts for from 45% to 75% by weight of the non-volatile solids. In some embodiments of the invention, the powder accounts for about 90% by weight of the non-volatile solids. Optionally, the semiconducting powder comprises n-type or p-type polycrystalline silicon. A charge director, as is known in the art, is then added and mixed with the toner to charge the toner particles.

For toners in which the concentration of semiconducting powder is greater than about 70% (dry weight of components), a binding material is added and mixed with the slurry to maintain integrity of the toner particles and prevent their tendency to disintegrate because of the high concentration of semiconductor powder. Optionally, the binding material is Aluminum Butoxide, which binds to silicon and to resins and charge directors used in producing a toner in accordance with an embodiment of the invention.

The result of the process is a semiconducting toner concentrate to which additional carrier liquid and charge director are added to as required to provide a semiconducting toner that is suitable for printing and has a desired concentration of non-volatile solids.

A semiconducting toner, in accordance with an embodiment of the invention, may be printed on a substrate to provide relatively well-defined semiconducting regions of electronic components, such as for example the semiconducting regions of FETFTs in an AMLCD. During printing of the toner, for example using an electrostatographic printer such as a Hewlett-Packard Indigo press, optoelectronic toner particles are electrostatically adhered to a photosensitive surface, referred to as a "photosensitive imaging plate" (PIP), of a cylindrical roller in a desired pixel pattern referred to as a latent image to be transferred to a substrate. Toner is applied to the latent image by a developer and the developed image transferred to the substrate. Optionally, the developed image is transferred to the substrate by first transferring the toner from the PIP to an intermediate transfer member (ITM) of the press and from the ITM to the substrate. On the ITM, the toner undergoes heating which causes the toner particles in the pattern to coalesce into a relatively smooth, continuous (within the "developed" area) layer or film. Along edges of the pattern, surface tension causes tentacles of toner particles to recede into and be absorbed into the bodies of the toner particles so that the edges are smooth and well defined. As noted above, use of an ITM is optional, and depending on resolution provided by the printer, printing can be performed directly from the PIP to the substrate. However, it is believed that the "film forming capability" of the ITM results in an improved printed pattern.

Resolution of the printed pattern as good as 20 microns can be achieved using a conventional electrostatographic printer such as the Hewlett-Packard Indigo press noted above. The inventors feel that pattern resolutions as good as 5-10 microns can be provided by modified versions of such printers. Resolution improving modifications to a Hewlett-Packard Indigo press might include generating latent images on the printer's PIP using a scanning laser beam that is focused to a smaller than conventional spot on the PIP, and/or using a PIP having thinner charge generating layers and/or decreasing space between the PIP and the printer's developer. In addition, optionally, to provide high resolution printed patterns, toners comprising toner particles that are smaller than conventional sized toner particles are produced to print the patterns. Optionally, "high-resolution" toners comprise toner particles that have diameters of about a micron or less.

An experimental diode has been produced using p-type and n-type semiconducting toners in accordance with an embodiment of the invention to test the suitability of the toners for producing p-n junctions. The toners were produced using a process similar to that described above for producing semiconducting toners in accordance with an embodiment of the invention. The p-type and n-type semiconducting toners were p-type and n-type polycrystalline silicon powders in concentrations by weight that were equal to about 90% of the weight of the non-volatile solids in the toners.

Figure 1B:
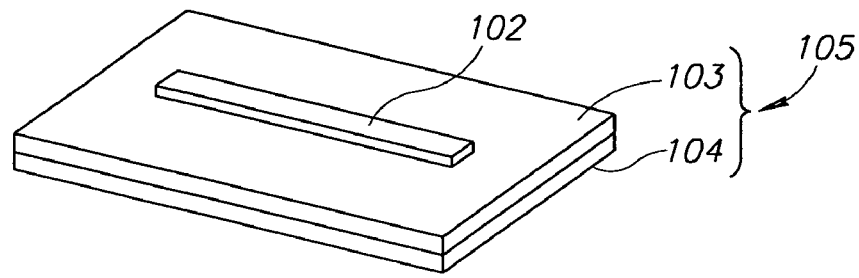
Figure 1C:
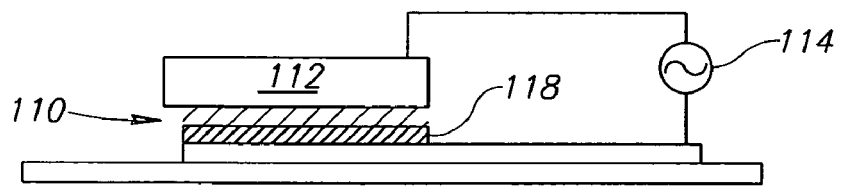
Figure 1D:
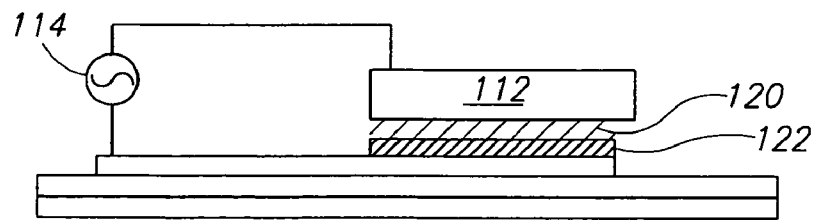

The procedure used to produce the experimental diode is schematically illustrated in FIGS. 1A-1F, in which thicknesses of substrates and layers of material formed on the substrates are greatly exaggerated for convenience of presentation. As schematically shown in FIG. 1A, a first conducting electrode 101 was formed on a sheet 100 of chromo 135 gram paper produced by Condat of France, by drop casting onto the paper a layer of PEDOT (polyethylenedioxithiophene) marketed under the trade name BAYTRON® (polyethylenedioxithiophene) by BAYER Chemical and Drug Company of Leverkusen, Germany. A second conducting electrode 102 was formed, as shown in FIG. 1B, on an adhesive decal film 103 on a backing sheet 104 of a sheet of decal paper 105 by depositing PEDOT on the decal film. Referring to FIG. 1C, a quantity of p-type toner 110 was then sandwiched between a conducting transfer plate 112 and first electrode 101. A source of voltage 114 generated a transfer voltage comprising an about eight second long 1500 volt pulse between transfer plate 112 and first electrode 101 to adhere a layer 118 of p-type toner particles in the toner to the first electrode. Similarly to the manner in which layer 118 of p-type toner particles was produced on first electrode 101 a layer 122 of n-type toner particles was produced on second electrode 102. As schematically shown in FIG. 1D, a quantity of n-type toner 120 was sandwiched between conducting plate 112 and second electrode 102 and a voltage pulse as described above was applied to adhere a layer 122 of n-type toner particles to the first electrode. The inventors estimate, from the size of the n-type and p-type toner particles used in the toners, and the amount of material deposited in layers 118 and 122, that layers 118 and layer 122 were between 5 and 10 microns thick.

Figure 1E:
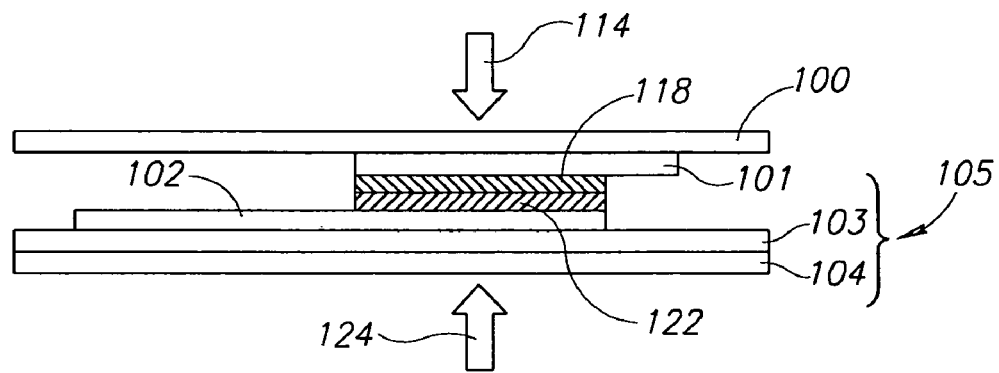
Figure 1F:
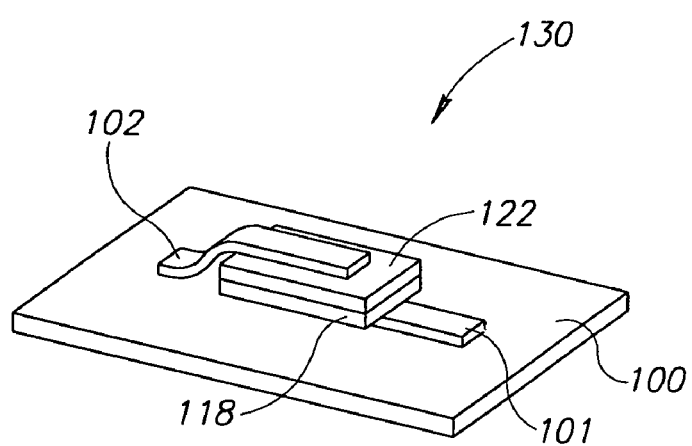

Following drying of p-type and n-type toner particle layers 118 and 122, as schematically shown in FIG. 1E CONDAT® paper 100 and decal paper 104 were brought into contact under moderate, manually generated, pressure indicated by block arrows 124 so that the p-type and n-type toner particle layers were in contact and formed a p-n junction. While under pressure, CONDAT® and decal papers 100 and 104 were heated so that decal film 103 melted and adhered n-type layer 118 and second electrode 102 in place on the CONDAT® paper. After the decal and CONDAT® papers were allowed to cool, backing 104 of the decal paper was removed to expose the completed experimental diode 130 schematically shown in FIG. 1F.

Figure 2:
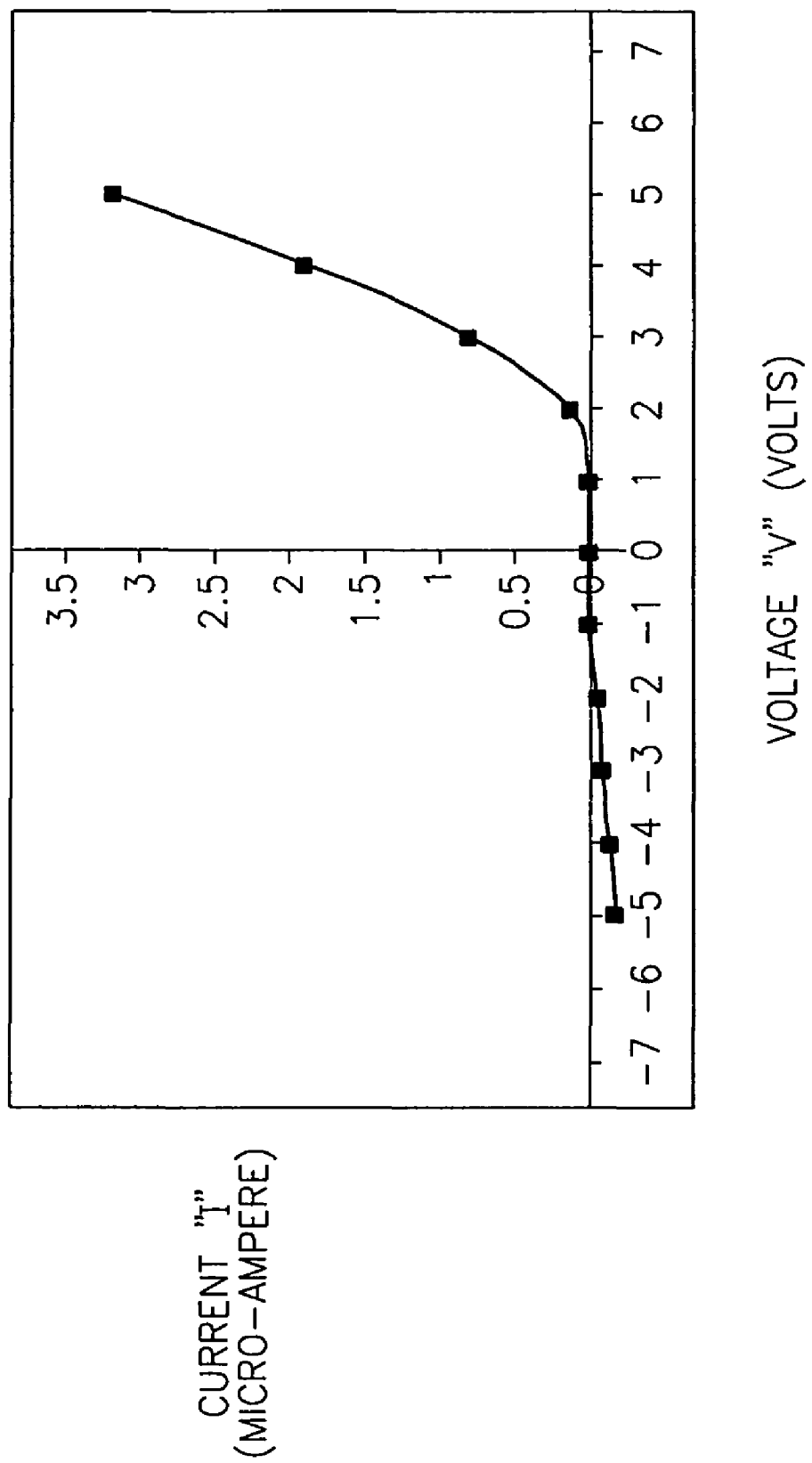
FIG. 2 shows a graph of current versus voltage for the diode whose production is illustrated in FIGS. 1A-1F, in accordance with an embodiment of the present invention.

A power supply was connected to first and second electrodes 101 and 102 of the diode to determine current carried by the diode as a function of voltage applied between the first and second electrodes and determine if the diode functioned properly. The dependence of current on voltage exhibited typical diode dependence, with a large forward current when the p-n-junction was forward biased, and very little current when the p-n junction was back biased. FIG. 2 shows a graph of current, I, in micro-amperes, verses voltage, V, in volts, as may be determined for the experimental diode.

While the method of producing the experimental diode is not a printing method, the method shares and demonstrates many of the features that make it possible to print the diode and other semiconductor devices using an electrostatographic printing process and variations of such processes. For example, toner layers having thicknesses of between 1 and 10 microns thick are readily printed using a conventional Hewlett-Packard Indigo press.

Such printing processes conventionally use heat and pressure to print smooth continuous layers of toner on a substrate, as for example noted above in the description of an electrostatographic printing process provided by a Hewlett-Packard Indigo printing press. Furthermore, in conventional electrostatographic printing, different pigmented toners are regularly printed one on top of, and intimately contiguous with, each other using heat and pressure to provide different colors. Similarly, an electrostatographic printer may be used to print patterned layers of different semiconductor toners, in accordance with embodiments of the invention, in intimate contiguous contact to form a desired configuration of, for example, p-n junctions on a substrate.

In some embodiments of the invention, semiconductor layers are printed sequentially one on top of the other and heated under pressure directly on a substrate to form semiconductor devices on the substrate. In some embodiments of the invention, patterns of semiconductor toner layers are formed and adhered one to the other on a photoreceptor surface or an intermediate transfer member surface and then transferred together as a single multilayer film to the substrate. In some embodiments of the invention, an electrostatographic printer may be used to print different semiconductor layers on different substrates. Similarly, to the manner in which the experimental diode was formed, the substrates are then brought into contact, registered one to the other and bonded together using any suitable bonding method to form semiconductor devices.

Intimate contact between layers of differing semiconducting materials is enhanced when the toner layers are formed into a film, especially on a heated intermediate transfer member.

Figure 3:
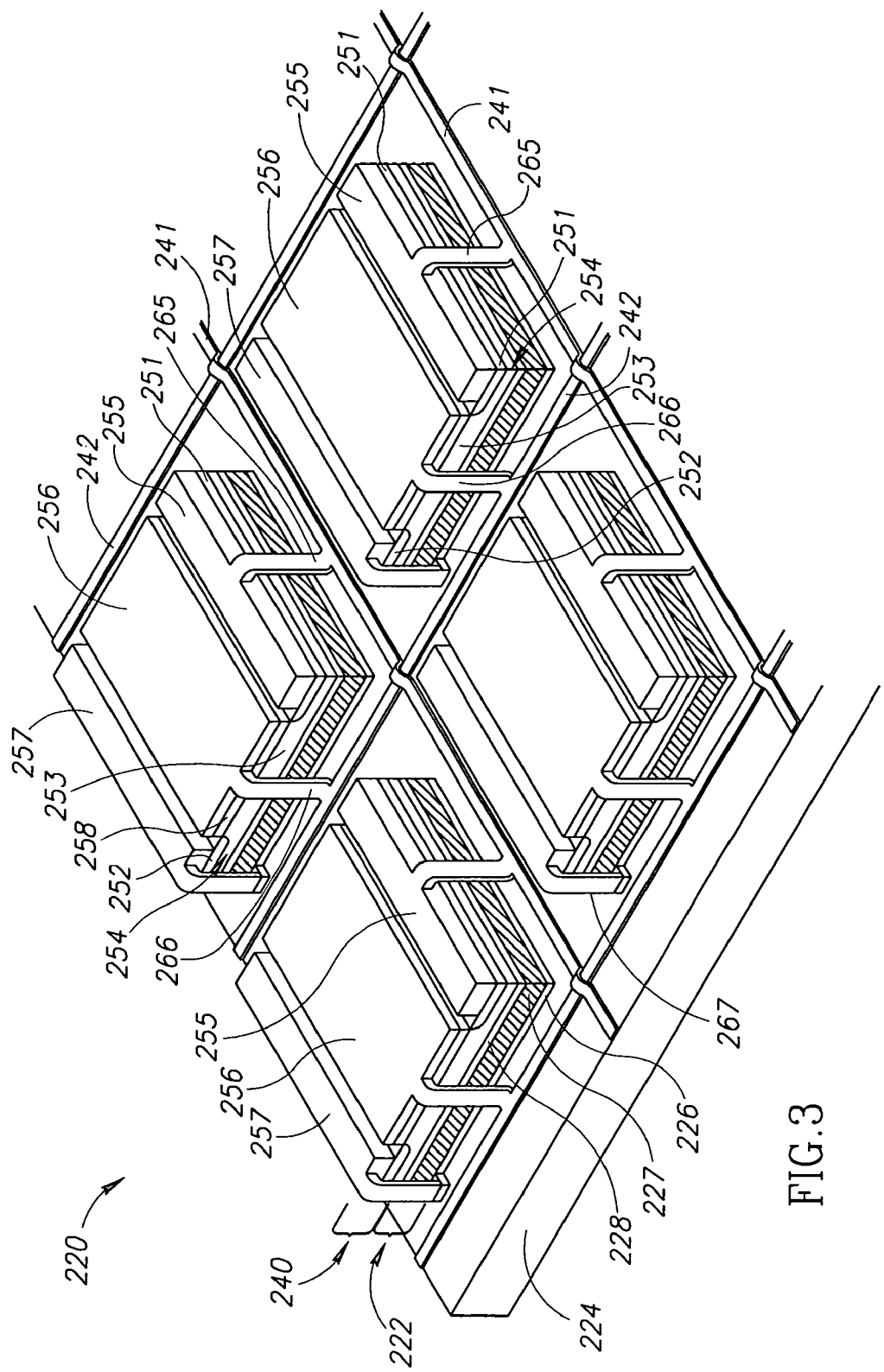
FIG. 3 schematically shows another configuration of a flat panel display comprising field effect thin film transistors FETFT transistors produced by printing semiconducting toners, in accordance with an embodiment of the invention.

FIG. 3 schematically shows a portion of an exemplary active matrix flat panel display, AMFPD 220, formed on a transparent substrate 224, such as a glass or polymer substrate, and comprising FETFTs 240 formed on light emitting elements (LEE) 222 that they control, in accordance with an embodiment of the invention. Optionally, as shown in FIG. 3, FETFTs 240 are formed on LEEs 222.

Spatial configurations for LEEs and FETFTs other than that shown in FIG. 3 are possible and can be advantageous. For example, FETFTs comprised in a display in accordance with an embodiment of the invention can be located beneath their associated LEEs on a side of a substrate opposite that on which the LEES are printed and connected to the LEEs by suitable vias. Optionally, FETFTs can be printed alongside their associated LEEs. Printing alongside may relax some registration constraints with respect to printing FETFT layers relative to LEE layers. However, an advantage of stacking an FETFT above or below a LEE that it controls rather than alongside the LEE, is that the footprint of the FETFT does not affect the size of the LEE for a given pixel size. For a given pixel size, in a side by side configuration, as the footprint of the FETFT grows, the footprint of the LEE in general decreases, resulting in a smaller LEE and smaller fill factor for the AMFPD. In a stacked configuration, the FETFT may, optionally have a footprint substantially equal to that of the LEE it controls.

Each LEE 222 comprises a layer 227 of a luminescent material sandwiched between first and second electrodes 226 and 228. Thickness of layer 227 is a function of the material used and its electrical and optical properties and is optionally between about 1 micron and 10 microns thick. Such thicknesses are within the range of liquid toner printing techniques, either by using standard techniques or by using lower charge/unit mass toner or by printing multiple layers. Electrodes 226 and 228 are, optionally, about a micron thick. In some embodiments of the invention, an electrode 226 and/or 228 is a fraction of a micron thick. Electrode 226 is formed from a conducting material that is substantially transparent to visible light in at least a portion of the visible spectrum in which optoelectronic layer 227 emits light when excited. Such conductor materials and methods for applying them in desired patterns are well known in the art. Optionally, electrodes 226 are formed by printing optionally, ITO (indium tin oxide), ATO (aluminum tin oxide) or a transparent conductive polymer such as BAYTRON® (polyethylenedioxithiophene) marketed by BAYER Chemical and Drug Company of Leverkusen Germany. If by way of example, AMFPD has a resolution of about 600 lines per inch, LEEs 222 have a footprint of about 40 microns by about 40 microns.

FETFT 240 comprises a source 251 and drain 252 that bracket a gate 253, which is part of a gate layer 254 formed on electrode 228, and source, gate and drain electrodes 255, 256 and 257 respectively. An insulating layer 258 electrically insulates gate electrode 257 from gate 253. Conducting tabs 265 and 267 couple FETFTs 240 to row and column address lines 241 and 242 respectively for selectively addressing each FETFT 240 and controlling the FETFT to connect its associated LEE 222 to a source (not shown) of AC or DC power as required that excites the LEE to emit light. Optionally, electrode 228 functions as a common ground electrode for LEE 222 and FETFT 240. Optionally, FETFT 240 couples LEE 222 to the power supply by connecting the power supply to LEE electrode 226, to which electrode the FETFT is coupled by a conducting tab 266. Width of gate 253 between source 251 and drain 252 is, optionally, between 5 to 20 microns. Thickness of the various components of FETFT 240 is in a range from a micron to a few microns. Optionally, FETFT has a footprint substantially the same as that of LEE 222. For convenience of presentation, and to prevent clutter, conductors that connect ground electrodes 228 to ground and FETFTs 240 to a power supply are not shown.

It is noted that in FIG. 3, layers in FETFT 240 and in LEEs 222 are shown with edges of a layer of material printed over an underlying layer perfectly aligned with the edges of the underlying layer. However, if an upper layer of material is printed over a lower layer with its edges aligned with edges of the lower layer, material in the upper layer will in general drip or flow over the edges of the underlying layer. In addition, there may be some misalignment that will cause such overflow. Unless such dripping or overflowing is desired (and generally it is not), the upper layer is, in general printed so that edges of the printed upper layer are recessed from the edges of the lower layer. For FETFT 240, for example, it is in general desired to prevent material in gate electrode 256 from dribbling over underlying layers on which it is printed. As a result, when printing gate electrode 256 in accordance with an embodiment of the invention, the gate electrode is printed so that its edges are slightly recessed from edges of insulating layer 258.

In an embodiment of the invention, electrode 226 and address lines 241 and 242 are printed or formed using any of various printing or forming methods and materials known in the art. By way of example, the electrodes and address lines may be printed using silkscreen printing, electrostatographic printing, thermal printing or ink jet printing. Exemplary methods of printing electrodes are described in U.S. Pat. No. 6,521,489 or U.S. Pat. No. 6,300,932, the disclosures of which are incorporated herein by reference. Following printing of the electrodes and address lines, luminescent layers 227 are printed. An electrode 228 is then printed on each luminescent layer 227.

Gate layer 254 comprising gate 253 is electrostatographically printed on electrode 228 of each FETFT 240 using, optionally, an n-type polycrystalline silicon or germanium semiconductor toner, in accordance with an embodiment of the invention. Source 251 and drain 252 of the FETFT are printed optionally using a p-type polycrystalline silicon or germanium semiconductor toner in accordance with an embodiment of the invention. Insulating layer 258 is formed on gate region 253, optionally by printing, optionally using an electromagnetic printing process, a layer of a dielectric material on the gate region. Source, drain and gate electrodes 255, 256 and 257 are then printed over the source, drain and gate respectively using any suitable printing technology. Conducting tabs 265, 266 and 267 are formed, optionally by printing, to respectively connect source electrode 255 to address line 241, gate electrode 256 to address line 242 and drain 257 to electrode 226. Electrode 228 is optionally connected to ground by a suitable configuration of electrodes, also optionally printed on substrate 224.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

What is claimed is:

1. A toner particle for use in electrostatic printing of a semiconducting electronic device, the particle comprising:
    a resin;
    solid semiconductor particles dispersed in the resin; and
    a binding material that binds the semiconductor particles to the resin.

2. The toner particle according to claim 1 wherein the toner particle has a relatively flat body from which relatively elongate tentacles extend.

3. The toner particle according to claim 1 wherein a concentration of the semiconductor particles is from 25% to 95% by weight of non-volatile solids in the toner particle.

4. The toner particle according to claim 1 wherein a concentration of the semiconductor particles is from 35% to 85% by weight of non-volatile solids in the toner particle.

5. The toner particle according to claim 1 wherein a concentration of the semiconductor particles is from 45% to 75% by weight of non-volatile solids in the toner particle.

6. The toner particle according to claim 1 wherein a concentration of the semiconductor particles is about 90% by weight of the non-volatile solids in the toner particles.

7. The toner particle according to claim 1 wherein the toner particles comprise a charge director and the binding material binds to the charge director.

8. The toner particle according to claim 1 wherein a concentration of semiconductor particles by weight is greater than about 70% of non-volatile solids in the toner particle.

9. The toner particle according to claim 1 wherein the binding material comprises Aluminum Butoxide.

10. The toner particle according to claim 1 wherein the semiconductor particles comprise silicon.

11. The toner particle according to claim 10 wherein the silicon comprises polycrystalline silicon.

12. The toner particle according to claim 11 wherein the polycrystalline silicon is p-type polycrystalline silicon.

13. The toner particle according to claim 11 wherein the polycrystalline silicon is n-type polycrystalline silicon.

14. The toner particle according to claim 1 wherein the semiconductor particles comprise germanium.

15. The toner particle according to claim 14 wherein the germanium comprises polycrystalline germanium.

16. The toner particle according to claim 15 wherein the polycrystalline germanium is p-type polycrystalline germanium.

17. The toner particle according to claim 15 wherein the polycrystalline germanium is n-type polycrystalline germanium.

18. The toner particle according to claim 1 wherein the resin comprises a material chosen from the group consisting of:
    Ethylene acrylic acid and methacrylic acid copolymer resin;
    Ethylene acrylic acid copolymer resin;
    Acid-modified ethylene acrylate copolymer resin;
    Copolymer of Ethylene-Glycidyl Methacrylate;
    Terpolymer of Ethylene-Methyl Acrylate-Glycidyl Methacrylate; and
    Terpolymer of Ethylene-Ethyl Acrylate-Maleic Anhydride.

19. A toner comprising toner particles according to claim 1 dispersed in a carrier liquid.

20. A method of producing a semiconducting device, comprising:
    forming a first semiconductor region on a substrate; and
    using an electrostatographic printing process to print a second semiconducting layer of toner particles in accordance with claim 1 that contacts the semiconductor region and forms a semiconducting junction with it.

21. The method according to claim 20 wherein forming the first semiconductor region comprises printing said region using an electrostatographic printing process utilizing toner particles comprising a resin, solid semiconductor particles dispersed in the resin, and a binding material that binds the semiconductor particles to the resin.

* * * * *